United States Patent
Yang

[19]

[11] Patent Number: 6,118,342
[45] Date of Patent: Sep. 12, 2000

[54] SYSTEM AND METHOD FOR PROVIDING PRECISE RF AMPLIFIER GAIN CONTROL OVER TEMPERATURE

[75] Inventor: Steve S. Yang, Newark, Calif.

[73] Assignee: Space Systems/Loral, Inc., Palo Alto, Calif.

[21] Appl. No.: 09/290,812

[22] Filed: Apr. 13, 1999

[51] Int. Cl.[7] .................................................. H03F 3/60
[52] U.S. Cl. ............................................ 330/289; 330/284
[58] Field of Search .................................. 330/89, 84, 79; 333/17.1, 81 R

[56] References Cited

U.S. PATENT DOCUMENTS

| | | | |
|---|---|---|---|
| 4,334,185 | 6/1982 | Turney et al. ........................... | 323/280 |
| 4,360,787 | 11/1982 | Galpin ..................................... | 330/284 |
| 4,450,413 | 5/1984 | Fujibayashi ............................. | 330/279 |
| 4,746,876 | 1/1993 | Sibiga .................................... | 330/284 |
| 5,177,453 | 1/1993 | Russell et al. .......................... | 330/284 |
| 5,179,353 | 1/1993 | Miyake ................................... | 330/129 |

*Primary Examiner*—Robert Pascal
*Assistant Examiner*—Henry Choe
*Attorney, Agent, or Firm*—Kenneth W. Float

[57] ABSTRACT

A system that precisely controls the gain of an RF amplifier over varying temperatures. The system monitors the temperature of the RF amplifier and precisely controls the diode current in PIN diodes to precisely control the gain of the RF amplifier.

11 Claims, 2 Drawing Sheets

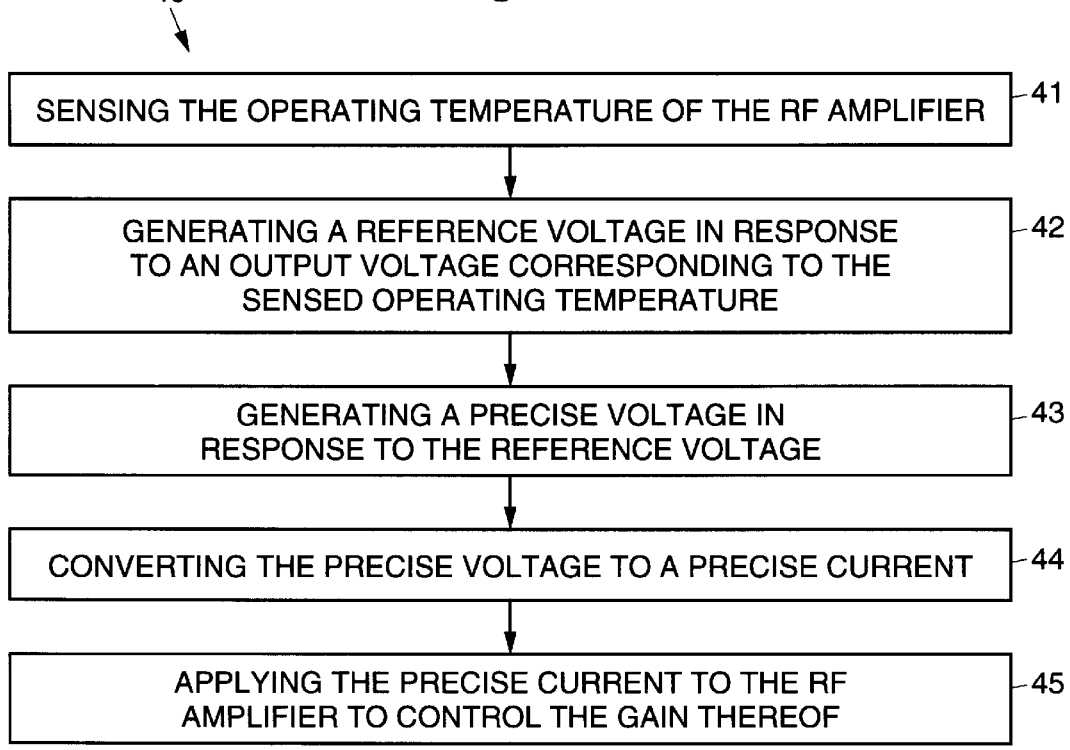

SYSTEM AND METHOD FOR PROVIDING PRECISE RF AMPLIFIER GAIN CONTROL OVER TEMPERATURE

BACKGROUND

The present invention relates generally to amplifier gain control systems and methods, and more particularly, to systems and methods for precisely controlling the gain of an RF amplifier chain over temperature.

Schemes for providing gain control over temperature of RF channel amplifiers and linearizers have heretofore used relatively complicated thermistor compensation methods which are require special skill to tune and have had difficulty in meeting rigorous performance specifications.

It is an objective of the present invention to provide for improved systems and methods for precisely controlling the gain of an RF amplifier chain over temperature.

SUMMARY OF THE INVENTION

The present invention provides for systems and methods that precisely control the gain of an RF amplifier, such as an RF channel amplifier, for example, over varying temperatures. The systems and methods monitor the temperature of the RF amplifier and precisely control the diode current in PIN diodes to precisely control the gain of the RF amplifier.

An exemplary system comprises an RF carrier circuit that includes the RF carrier amplifier and the plurality of PIN diodes. An interface circuit 20 comprises a current control operational amplifier that outputs a current to control the amount of attenuation provided by the PIN diodes and a temperature sensor operational amplifier that regulates the current control operational amplifier to output the same amount of current over varying operating temperatures. An RF gain control circuit comprises a digital to analog converter that generates a precise voltage that is converted to a precise current to precisely control the gain of the RF carrier amplifier, circuitry that generates a reference voltage for the digital to analog converter that varies with the output voltage produced by the temperature sensor operational amplifier, and circuitry that adjusts the amount of attenuation provided by the PIN diodes.

An exemplary method for precisely controlling the gain of an RF amplifier over temperature comprises the following steps. The operating temperature of the RF amplifier is sensed. A reference voltage is generated in response to an output voltage corresponding to the sensed operating temperature. A precise is generated in response to the reference voltage. The precise voltage is converted to a precise current. The precise current is applied to the RF amplifier to control the gain thereof.

BRIEF DESCRIPTION OF THE DRAWINGS

The various features and advantages of the present invention may be more readily understood with reference to the following detailed description taken in conjunction with the accompanying drawing figures, wherein like reference numerals designate like structural elements, and in which:

FIG. 2 illustrates an exemplary method in accordance with the principles of the present invention.

DETAILED DESCRIPTION

Figure 1:
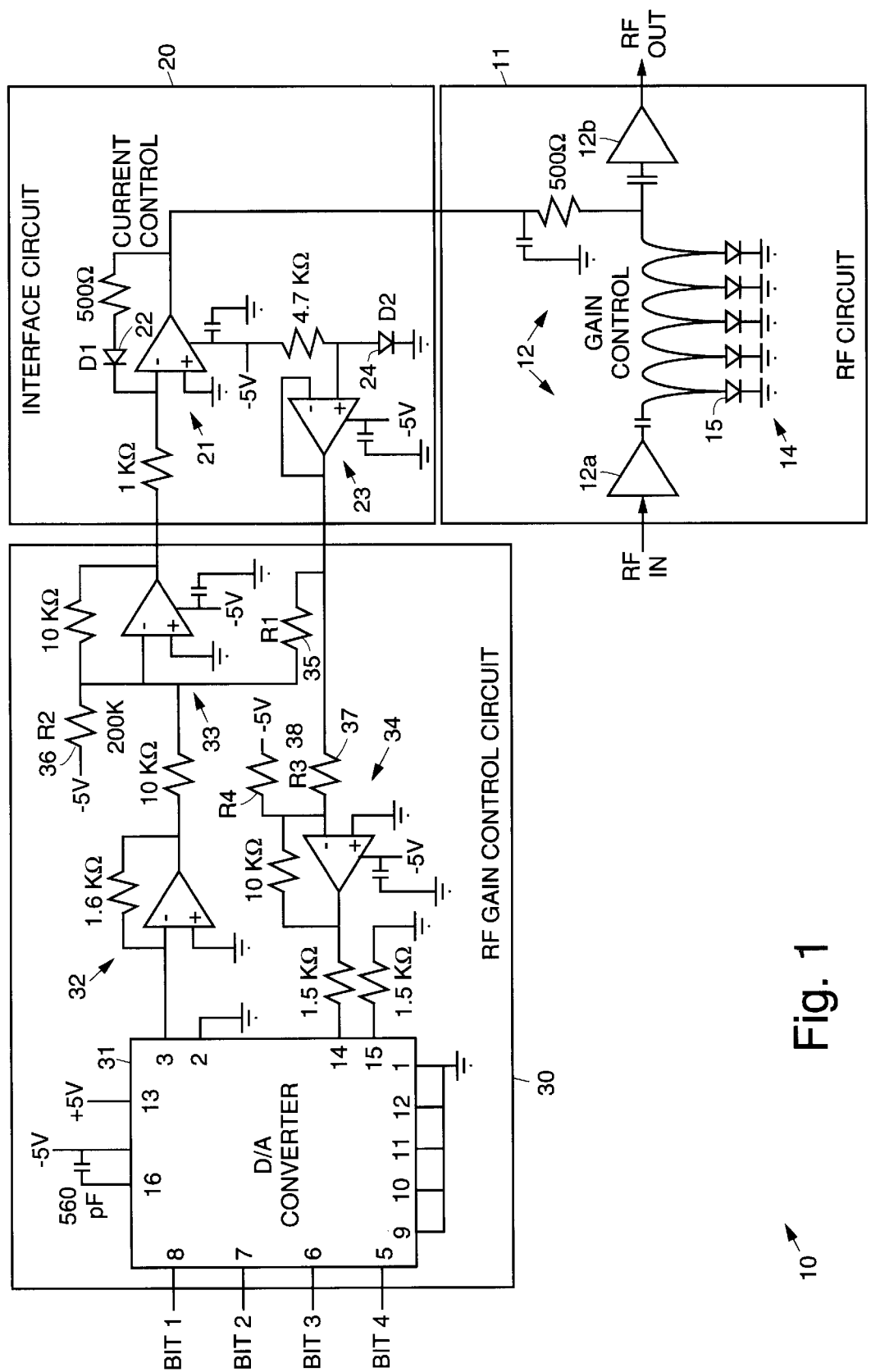
FIG. 1 illustrates an exemplary system in accordance with the principles of the present invention for precisely controlling the gain of an RF amplifier over temperature.

Referring to the drawing figures, FIG. 1 illustrates an exemplary system 10 in accordance with the principles of the present invention for providing precise gain control of an RF carrier amplifier 12 over temperature. Details of the construction of the system 10 should be self-evident from a review of FIG. 1, and thus the circuitry shown in FIG. 1 will not be discussed in detail.

An RF carrier circuit 11 includes the RF carrier amplifier 12 which comprises input and output RF MMIC carrier amplifiers 12a, 12b and a PIN diode attenuator 14 coupled between the input and output RF MMIC carrier amplifiers 12a, 12b. The PIN diode attenuator 14 is used to control the RF gain of the RF carrier amplifier 12. The PIN diode attenuator 14 contains a plurality of PIN diodes 15.

To control the amount of attenuation provided by the PIN diodes 15, they are connected to a current control operational amplifier 21 that is part of an interface circuit 20. The current control operational amplifier 21 provides the required amount of current to control the attenuation provided by the PIN diodes 15.

The current provided by the PIN diodes 15 is nonlinear with respect to the control voltage provided by the current control operational amplifier 21. Furthermore, the amount of nonlinearity varies with temperature. The current control operational amplifier 21 outputs a control voltage that is converted to current to control the PIN diodes 15. The control voltage must be controlled so that it can provide the same amount of current over varying operating temperatures. The current control operational amplifier 21 includes a current control diode (D1) 22 in a feedback loop that performs this function.

The interface circuit 20 comprises a temperature sensor operational amplifier 23 that includes a temperature sensor diode (D2) 24. The temperature sensor diode (D2) 24 is a temperature sensor that varies the output voltage of the operational amplifier 23 according to the temperature of the temperature sensor diode (D2) 24.

The current control diode (D1) 22 and the temperature sensor diode (D2) 24 in the interface circuit 20, and the PIN diodes 15 in the RF carrier circuit 11 are physically packaged very close to each other. Consequently, the temperatures experienced by the diodes 22, 24 and the PIN diodes 15 are very nearly the same. Hence, the temperature of the PIN diodes 15 are monitored by the temperature sensor diode (D2) 24.

An RF gain control circuit 30 is provided that comprises a digital to analog (D/A) converter 31, first, second and third control operational amplifiers 32, 33, 34 that are coupled to the D/A converter 31, the current control operational amplifier 21 and the temperature sensor operational amplifier 23 in the manner shown in FIG. 1. The second control operational amplifier 33 has first and second resistors (R1, R2) 35, 36 that are used to adjust the amount of attenuation provided by the PIN diodes 15 in order to compensate the gain of the RF carrier amplifiers 12a, 12b for changes in temperature. The D/A converter 31 has a plurality of digital control input signals (BITS 1–4) that generate step voltage to step change gain of the RF carrier amplifier 12.

The third control operational amplifier 34 includes third and fourth resistors (R3, R4) 37, 38 that are used to generate a reference voltage for the D/A converter 31. The reference voltage varies in accordance with the output voltage produced by the temperature sensor operational amplifier 23. The D/A converter 31 generates a precise voltage that is converted to a precise current by the current control operational amplifier 21 to precisely control the gain of the RF carrier amplifier 12.

Referring now to FIG. 2, it illustrates an exemplary method 40 in accordance with the principles of the present invention. The exemplary method 40 precisely controlling the gain of an RF amplifier 12 over temperature, which RF amplifier 12 includes a gain control circuit comprising a plurality of PIN diodes 15. The exemplary method 40 comprises the following steps.

The operating temperature of the RF amplifier 12 is sensed 41 using a temperature sensing circuit comprising the temperature sensor operational amplifier 23 and temperature sensor diode (D2) 24. A reference voltage is generated 42 in response to an output voltage generated by the temperature sensing circuit. A precise voltage is generated 43 by the D/A converter 31 in response to the reference voltage. The precise voltage is converted 44 to a precise current by the current control operational amplifier 21. The precise current is applied 45 to a plurality of PIN diodes 15 of the gain control circuit to control the attenuation provided thereby.

Thus, systems and methods for providing precise gain control of an RF amplifier over temperature have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A system precisely controlling the gain of an RF amplifier over temperature comprising:

an RF carrier circuit comprising the RF carrier amplifier and a PIN diode attenuator having a plurality of PIN diodes;

an interface circuit comprising a current control operational amplifier that outputs a current to control the amount of attenuation provided by the PIN diodes and a temperature sensor operational amplifier that regulates the current control operational amplifier to output the same amount of current over varying operating temperatures; and an RF gain control circuit comprising a digital to analog converter, circuitry coupled between the digital to analog converter and the current control operational amplifier and temperature sensor operational amplifier, that adjusts the amount of attenuation provided by the PIN diodes, that generates a reference voltage for the digital to analog converter that varies with the output voltage produced by the temperature sensor operational amplifier, and wherein the digital to analog converter generates a precise voltage that is converted to a precise current by the current control operational amplifier to precisely control the gain of the RF carrier amplifier.

2. The system recited in claim 1 wherein the interface circuit further comprises a current control operational amplifier including a current control diode that outputs a desired amount of current to control the amount of attenuation provided by the PIN diodes and a temperature sensor operational amplifier including a temperature sensor control diode that causes the current control operational amplifier to output the same amount of current over varying operating temperatures, and wherein the current control diode, the temperature sensor control diode and the PIN diodes are disposed very close to each other so that they experience substantially the same temperature.

3. The system recited in claim 1 wherein the current control operational amplifier comprises a current control diode that controls the amount of current output by the current control operational amplifier over varying temperatures.

4. The system recited in claim 1 wherein the temperature sensor operational amplifier includes a temperature sensor control diode that causes the current control operational amplifier to output the same amount of current over varying operating temperatures.

5. The system recited in claim 1 wherein the circuitry in the RF gain control circuit comprises:

first, second and third control operational amplifiers coupled to the current control operational amplifier and the temperature sensor operational amplifier;

the second control operational amplifier including first and second resistors for adjusting the amount of attenuation provided by the PIN diodes; and the third control operational amplifier including third and fourth resistors that generate a reference voltage for the digital to analog converter that varies with the output voltage produced by the temperature sensor operational amplifier.

6. A system precisely controlling the gain of an RF amplifier over temperature comprising:

an RF carrier circuit comprising the RF carrier amplifier 12 and a PIN diode attenuator having a plurality of PIN diodes;

an interface circuit comprising a current control operational amplifier including a current control diode that outputs a desired amount of current to control the amount of attenuation provided by the PIN diodes and a temperature sensor operational amplifier including a temperature sensor control diode that causes the current control operational amplifier to output the same amount of current over varying operating temperatures;

wherein the current control diode, the temperature sensor control diode and the PIN diodes are disposed very close to each other so that they experience substantially the same temperature; and an RF gain control circuit comprising a digital to analog converter, first, second and third control operational amplifiers coupled to the current control operational amplifier and the temperature sensor operational amplifier, the second control operational amplifier including first and second resistors for adjusting the amount of attenuation provided by the PIN diodes, the third control operational amplifier including third and fourth resistors that generate a reference voltage for the digital to analog converter that varies with the output voltage produced by the temperature sensor operational amplifier, and wherein the digital to analog converter generates a precise voltage that is converted to a precise current by the current control operational amplifier to precisely control the gain of the RF carrier amplifier.

7. A method for precisely controlling the gain of an RF amplifier over temperature, comprising the steps of:

sensing the operating temperature of the RF amplifier using a temperature sensing circuit comprising a temperature sensor operational amplifier and a temperature sensor control diode;

generating a reference voltage in response to an output voltage corresponding to the sensed operating temperature;

generating a precise voltage in response to the reference voltage;

converting the precise voltage to a precise current; and applying the precise current to the RF amplifier to control the gain thereof.

8. The method recited in claim 7 wherein the reference voltage generating step comprises generating a reference voltage in response to an output voltage generated by the temperature sensing circuit.

9. The method recited in claim 7 wherein the precise voltage generating step comprises generating a precise voltage using a D/A converter in response to the reference voltage.

10. The method recited in claim 7 wherein the converting step comprises converting the precise voltage to a precise current using a current control operational amplifier.

11. The method recited in claim 7 wherein the applying step comprises applying the precise current to a plurality of PIN diodes of a gain control circuit coupled to the RF amplifier to control the attenuation provided by the PIN diodes and control the gain of the RF amplifier.

* * * * *